(12) United States Patent
Onoue et al.

(10) Patent No.: US 9,491,868 B2
(45) Date of Patent: Nov. 8, 2016

(54) CONDUCTIVE RESIN COMPOSITION, METHOD FOR MANUFACTURING ELECTRONIC COMPONENT USING SAME, BONDING METHOD, BONDING STRUCTURE, AND ELECTRONIC COMPONENT

(75) Inventors: Tomoaki Onoue, Nagaokakyo (JP);
Masaaki Hirayama, Nagaokakyo (JP);
Yoshiki Aburatani, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 365 days.

(21) Appl. No.: 13/206,693

(22) Filed: Aug. 10, 2011

(65) Prior Publication Data

US 2011/0293922 A1 Dec. 1, 2011

Related U.S. Application Data

(63) Continuation of application No. PCT/JP2010/052175, filed on Feb. 15, 2010.

(30) Foreign Application Priority Data

Feb. 16, 2009 (JP) .................................. 2009-032759

(51) Int. Cl.
*H01R 4/04* (2006.01)
*H05K 3/32* (2006.01)
*H01R 4/58* (2006.01)
*H01R 4/00* (2006.01)

(52) U.S. Cl.
CPC ................ *H05K 3/321* (2013.01); *H01R 4/00* (2013.01); *H01R 4/58* (2013.01); *H01R 4/04* (2013.01); *H05K 2201/0323* (2013.01); *Y10T 428/25* (2015.01)

(58) Field of Classification Search
USPC ..................... 428/323, 414; 439/91; 524/847
See application file for complete search history.

(56) References Cited

U.S. PATENT DOCUMENTS 3,861,135 A * 1/1975 Seeger et al. ................... 368/88
4,095,411 A * 6/1978 Kondo .......................... 368/250
4,701,279 A * 10/1987 Kawaguchi et al. ......... 252/511

(Continued)

FOREIGN PATENT DOCUMENTS

CN 1362459 A 8/2002
JP 63-051467 A 3/1988

(Continued)

OTHER PUBLICATIONS

English Machine Translation of JP3681266, obtained May 31, 2012 from JPO.*

(Continued)

*Primary Examiner* — Nicholas Kokkinos
(74) *Attorney, Agent, or Firm* — Arent Fox LLP (57) ABSTRACT

A conductive resin composition which includes (a) a curable resin and (b) hard spherical carbon formed by coating the surface of a spherical base carbon particle with fine carbon particles and/or pitch-derived fine carbon pieces is used to electrically bond two conductive elements. The conductive resin composition is supplied to a space between areas of at least two works respectively having the areas to be electrically connected to each other, and the conductive resin composition is cured while applying a pressure between the areas.

10 Claims, 8 Drawing Sheets

(56) References Cited

U.S. PATENT DOCUMENTS

| | | |
|---|---|---|
| 5,407,741 A | 4/1995 | Ota |
| 6,356,333 B1 | 3/2002 | Uchiyama |
| 2007/0238826 A1* | 10/2007 | Fischer et al. ............... 524/496 |

FOREIGN PATENT DOCUMENTS

| | | | |
|---|---|---|---|
| JP | 1-108276 A | | 4/1989 |
| JP | 3-006884 A | | 1/1991 |
| JP | 10-251546 A | | 9/1998 |
| JP | 10-251547 A | | 9/1998 |
| JP | 11-100524 A | | 4/1999 |
| JP | 3681266 | * | 4/1999 |
| JP | 11-140342 A | | 5/1999 |
| JP | 11-157816 A | | 6/1999 |
| JP | 2000-219864 A | | 8/2000 |
| JP | 2003-527735 A | | 9/2003 |
| JP | 3468103 B2 | | 11/2003 |
| JP | 2004-323345 A | | 11/2004 |
| JP | 2005-120284 A | | 5/2005 |
| JP | 2005-353387 A | | 12/2005 |
| JP | 2006-339163 A | | 12/2006 |
| JP | 2008-094962 A | | 4/2008 |

OTHER PUBLICATIONS

M. Popov, M. Kyotani, R.J. Nemanich, Y. Koga, "Superhard phase composed of single-wall carbon nanotubes," Published Jan. 2002, The American Physical Society, Physical Review B, vol. 65, Article 033408.*

Gerald D. Mahan, "Amorphous Solid," Dec. 7, 2014, Encyclopedia Britannica, http://www.britannica.com/EBchecked/topic/21328/amorphous-solid.*

Written Opinion of the International Searching Authority, mailed May 18, 2010 (Japanese with English translation).

* cited by examiner

CONDUCTIVE RESIN COMPOSITION, METHOD FOR MANUFACTURING ELECTRONIC COMPONENT USING SAME, BONDING METHOD, BONDING STRUCTURE, AND ELECTRONIC COMPONENT

This is a continuation of application Serial No. PCT/JP2010/052175, filed Feb. 15, 2010, the entire contents of which is incorporated herein by reference.

TECHNICAL FIELD

The present invention relates to a conductive resin composition in which carbon is used as a conductive particle, and a method for manufacturing an electronic component, a bonding method, a bonding structure, and an electronic component, using the composition.

BACKGROUND ART

An adhesive is used when an electrode of an electronic component is electrically and mechanically connected to a land of a substrate during mounting the electronic component on the substrate or when the electronic component is accommodated in a metallic case and the electronic component is electrically and mechanically connected to the metallic case by bonding the electrode of the electronic component to a bottom of the metallic case. The adhesive can be a conductive adhesive (conductive resin composition) formed by dispersing conductive particles in a liquid matrix resin. When the matrix resin in the conductive adhesive is cured, the electronic component is mechanically bonded to the substrate and an external electrode of the electronic component is electrically connected to the land of the substrate by the conductive particles contained in the matrix resin.

As one of such conductive adhesive, known is a conductive adhesive in which a carbon particle is used as the conductive particle. However, the carbon particle has a problem in that it has a higher resistance value than particles of conductive metals such as Ag and Cu.

In order to solve this problem, a bonding method has been proposed which aims to reduce the resistance between objects to be bonded in which a conductive adhesive including carbon particles is interposed between the objects to be bonded, for example, between a land and an electrode, where the carbon particles are destructed (shattered) by pressing the conductive adhesive, and the matrix resin of the adhesive is cured with an increased number of contacting points increased (refer to Patent Document 1).

However, when the carbon particles having such a low strength that the carbon particles are destructed by pressing are used, there is a problem that although the number of contacting points increases, an anchor effect, which is developed by incorporating the carbon particles into the electrode or the land, is not achieved, and therefore electric conduction is easily impaired by mechanical or thermal, impact and connection reliability is low.

PRIOR ART DOCUMENTS

Patent Document 1: Patent Publication No. 3468103

DISCLOSURE OF THE INVENTION

Problem to be Solved by The Invention

The present invention is aimed at solving the above-mentioned problem, and it is an object of the present invention to provide a conductive resin composition with which connection resistance is low, and high conduction reliability (being resistant to mechanical and thermal impacts) can be attained, a method for manufacturing, using the composition, an electronic component having high bonding reliability, a bonding method and a bonding structure by which objects to be bonded can be bonded to each other with certainty, and a highly reliable electronic component having the bonding structure.

Means for Solving the Problem

In order to solve the above-mentioned problem, the conductive resin composition of the present invention includes (a) a curable resin and (b) hard spherical carbon formed by coating the surface of a spherical base carbon particle with fine carbon particles and/or pitch-derived fine carbon pieces.

The hard spherical carbon in the present invention is spherical carbon in which the particle strength measured by a compression test is 200 MPa or more, and the half bandwidth of a G-band in raman spectra is 75 cm$^{-1}$ or less. In addition, the hard carbon is a material which is also referred to as "hard amorphous carbon" or "glassy carbon", and is thought to have "hardness several times higher than that of iron". Further, as the fine carbon particles, hard carbon black can be used.

The average particle diameter of the hard spherical carbon is preferably 10 μm or less.

Further, the conductive resin composition of the present invention preferably contains the hard spherical carbon at the proportion of 0.5 to 20% by weight.

Further, the method for manufacturing an electronic component of the present invention includes the step of supplying the conductive resin composition to a space between areas of at least two works respectively having the areas to be electrically connected to each other, and the step of curing the conductive resin composition while applying a pressure between the areas.

The method for manufacturing an electronic component of the present invention is particularly significant when it is applied to the case where at least one of works having areas to be electrically connected to each other is a piezoelectric element having an electrode as an area to be connected.

A bonding method of the present invention includes (a) the step of opposing one conductor to another conductor with the conductive resin composition which contains hard spherical carbon having higher hardness than the one conductor and the other conductor, interposed therebetween, (b) the step of press-contacting the one conductor against the other conductor with the conductive resin composition interposed therebetween so that a part of the hard spherical carbon is incorporated into the one conductor and the other conductor opposed to each other, and fine carbon particles and/or fine carbon pieces on the surface of the hard spherical carbon are incorporated into the one conductor and the other conductor, and (c) the step of curing the conductive resin composition in a state in which the one conductor is pressed against the other conductor with the conductive resin composition interposed therebetween.

A bonding structure of the present invention is a bonding structure for bonding one conductor to another conductor so as to be electrically conducted, wherein the conductive resin composition which contains hard spherical carbon having higher hardness than the one conductor and the other conductor, is interposed between the one conductor and the other conductor, and the conductive resin composition is cured in a state in which a part of the hard spherical carbon is incorporated into the one conductor and the other conductor opposed to each other, and the fine carbon particles and/or the fine carbon pieces on the surface of the hard spherical carbon are incorporated into the one conductor and the other conductor.

An electronic component of the present invention can be where at least one of the conductors is an electrode disposed on a piezoelectric element.

Effects of the Invention

Since the conductive resin composition of the present invention includes (a) a curable resin and (b) hard spherical carbon formed by coating the surface of a spherical base carbon particle with fine carbon particles and/or pitch-derived fine carbon pieces, and the hard spherical carbon has higher hardness than a metal, such as Cu or Ag, composing an electrode or a land which is an object to be bonded, the hard spherical carbon is incorporated into the conductors, and the fine carbon particles and/or the fine carbon pieces on the surface of the hard spherical carbon are incorporated into the conductors by interposing the conductive resin composition of the present invention between the objects to be bonded (between conductors) and press-contacting the objects with each other by an appropriate pressure. As a result of this, the number of conductor contacting points and the contacting area increase to reduce connection resistance, and it becomes possible to perform high conduction reliability bonding.

The hard spherical carbon of the present invention in which the surface of the spherical base carbon particle is coated with the pitch-derived fine carbon pieces, denotes, for example, hard spherical carbon formed by coating the surface of a spherical carbon material to be formed into hard carbon through firing with pitch, and then firing/graphitizing the coated carbon.

Since the curable resin in the conductive resin composition of the present invention is to be cured in a state in which the fine carbon particles and/or the fine carbon pieces on the surface of the hard spherical carbon are incorporated into the conductors, a highly reliable bonding state, which is highly resistant to a mechanical impact and a thermal impact, can be realized by the anchor effect of the fine carbon particles or pieces incorporated into the conductors.

It becomes possible by using the hard spherical carbon having an average particle diameter of 10 μm or less as the hard spherical carbon, it becomes possible to increase the number of carbon particles contained in the conductive resin composition, and it becomes possible to increase the number of contacting points to reduce connection resistance. In addition, generally, the primary particle diameters of the fine carbon particles and the fine carbon pieces are preferably 0.1 μm or less. Further, the proportions of the fine carbon particles and the fine carbon pieces in the hard spherical carbon are not particularly limited as long as the fine carbon particles and the fine carbon pieces are present in such amounts as to cover the surface of the spherical base carbon particle, but, usually, the proportions are preferably in the range of 1 to 40% by weight.

By containing the hard spherical carbon at the proportion of 0.5 to 20% by weight, it becomes possible to ensure a required conducting property. That is, when the content of the hard spherical carbon is less than 0.5% by weight, the number of contacting points and the contacting area decrease and sufficient conduction is not achieved, and when the content is more than 20% by weight, the viscosity of the conductive resin composition is too high, and therefore workability of application to a face to be bonded is deteriorated.

Since the conductive resin composition of the present invention is supplied to the space between areas of at least two works having the areas to be electrically connected to each other in the method for manufacturing an electronic component of the present invention, and the conductive resin composition is cured while applying a pressure between the areas, it becomes possible to incorporate the hard spherical carbon and the fine carbon particles and/or the fine carbon pieces on the surface of the hard spherical carbon into the areas of the work to connect such areas to each other with certainty, and therefore, an electronic component having low connection resistance and high conduction reliability can be manufactured with efficiency.

In the case where at least one of the works having the areas to be electrically connected to each other is a piezoelectric element having an electrode which is an area to be connected, the reliability of electrical connection tends to deteriorate since the piezoelectric element extends and contracts through the application of a voltage. However, when the method for manufacturing an electronic component of the present invention is employed in this situation, the manufacturing method is particularly significant since it becomes possible to obtain an electronic component having high bonding reliability, and which is highly resistant to a mechanical impact and a thermal impact by the above-mentioned anchor effect.

In the bonding method of the present invention, (a) one conductor is opposed to the other conductor with the conductive resin composition of the present invention interposed therebetween, (b) one conductor is press-contacted against the other conductor with the conductive resin composition interposed therebetween so that a part of the hard spherical carbon is incorporated into the one conductor and the other conductor, and the fine carbon particles and/or the fine carbon pieces on the surface of the hard spherical carbon are incorporated into the one conductor and the other conductor, and (c) the conductive resin composition is cured in this state of being press-contacted. As a result, it is possible to ensure the number of contacting points and contacting area sufficiently, develop the anchor effect, and mechanically and electrically connect the one conductor to the other conductor with certainty.

Since the conductive resin composition containing the hard spherical carbon having higher hardness than one conductor and the other conductor is interposed between one conductor and the other conductor, and the conductive resin composition is cured in a state in which a part of the hard spherical carbon is incorporated into one conductor and the other conductor and the fine carbon particles and/or the fine carbon pieces on the surface of the hard spherical carbon are incorporated into the conductors, it is possible in the bonding structure of the present invention to ensure the number of contacting points and contacting area sufficiently, develop the anchor effect, and perform good bonding in which conduction reliability is high.

Further, since the electronic component of the present invention is excellent in resistance to a mechanical impact, it can realize high connection reliability even when at least one of one conductor and the other conductor is an electrode disposed on a piezoelectric element.

MODE FOR CARRYING OUT THE INVENTION

Hereinafter, examples of the present invention will be shown, and thereby, features of the present invention will be described in more detail.

Example 1

Figure 1:
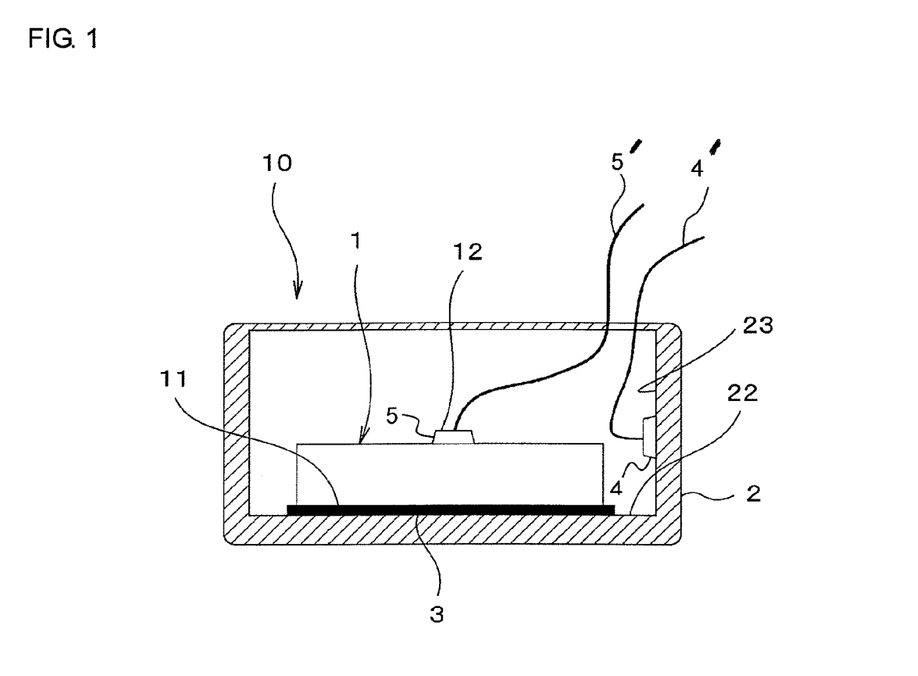
FIG. 1 is a view showing an electronic component having a bonding structure of an example (Example 1) of the present invention.
Figure 2:
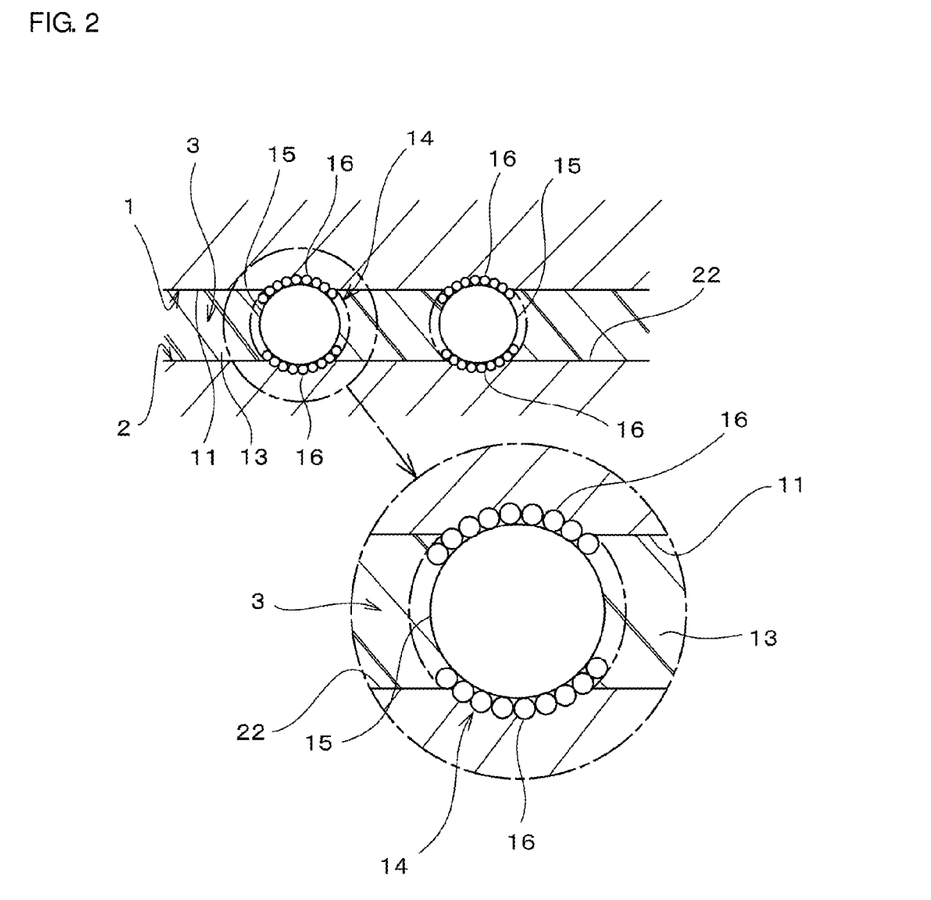
FIG. 2 is an enlarged view of a main section of the electronic component in FIG. 1.

FIG. 1 is a view showing an electronic component having a bonding structure of an example (Example 1) of the present invention, and FIG. 2 is an enlarged view of a main section of the electronic component in FIG. 1.

Figure 3:
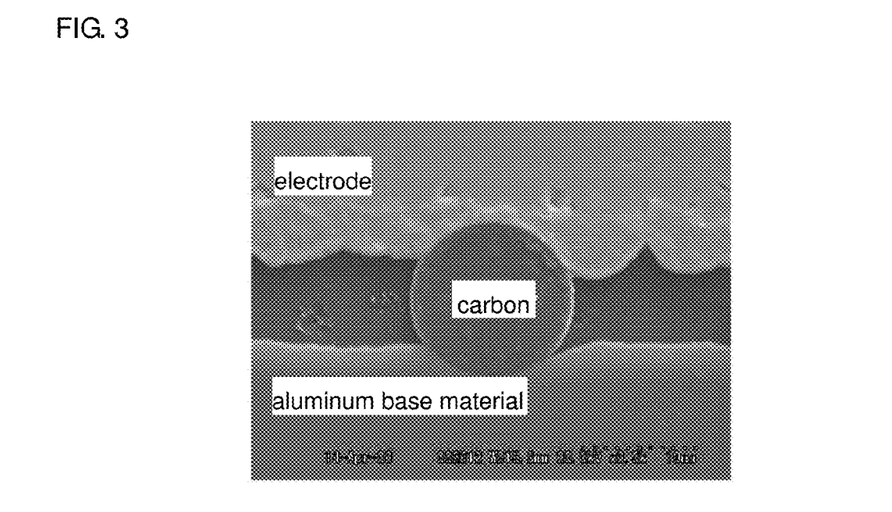
FIG. 3 is a microscope photograph of a bonding structure of an electrode and an aluminum base material in the electronic component in Example 1 of the present invention.
Figure 4:
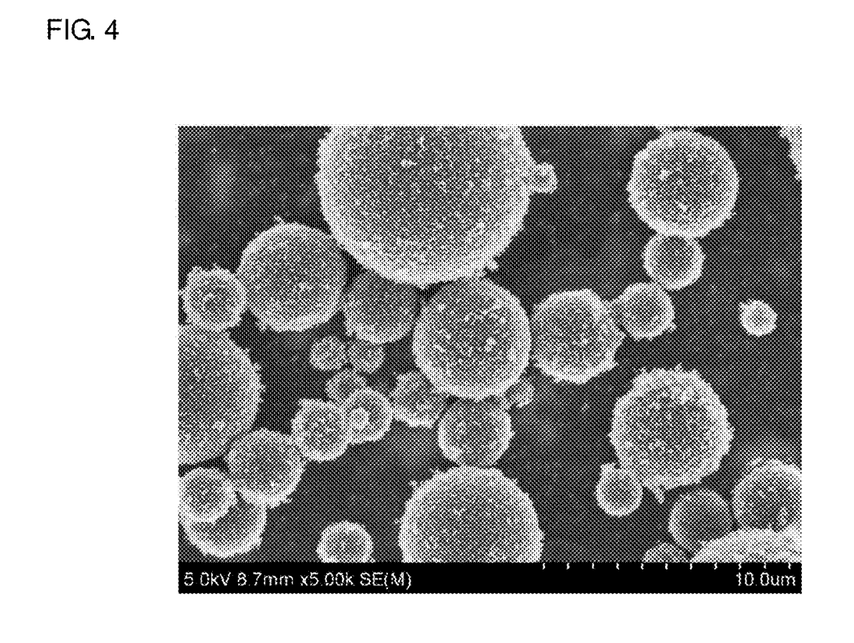
FIG. 4 is a microscope photograph of hard spherical carbon (hard spherical carbon, the surface of which is coated with fine carbon particles), used in a conductive resin composition in Example 1 of the present invention.
Figure 5:
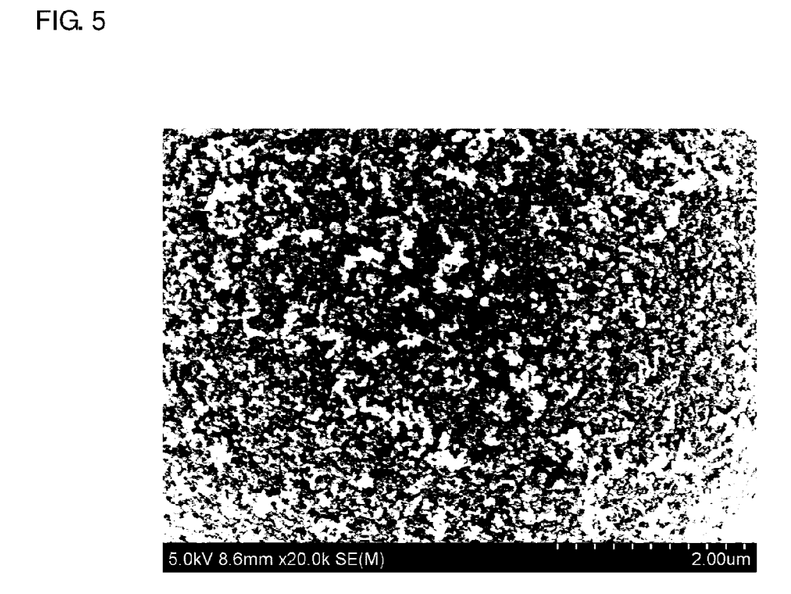
FIG. 5 is a microscope photograph of fine carbon particles on the surface of the hard spherical carbon in FIG. 4.

Further, FIG. 3 is a microscope photograph of a bonding structure in the electronic component in Example 1, FIG. 4 is a microscope photograph of hard spherical carbon used in a conductive resin composition in Example 1, and FIG. 5 is a microscope photograph of fine carbon particles on the surface of the hard spherical carbon.

This electronic component 10 includes a ceramic element (piezoelectric element) 1 provided with electrodes 11 and 12 on a lower face and an upper face thereof, an aluminum case 2 housing the ceramic element 1, a conductive resin composition (conductive adhesive) 3 which electrically connects and makes conduction between the electrode (first conductor in the present invention) 11 on the lower face of the ceramic element 1 and a bottom (second conductor in the present invention) 22 of the case 2, and mechanically bonds the electrode 11 on the lower face of the ceramic element 1 to the bottom 22 of the case 2, an electrical lead 4' is connected to a first terminal 4 which is electrically connected to a side 23 of the case 2, and conducts to the electrode 11 on the lower face of the ceramic element 1 through the case 2, and an electrical lead 5' is connected to a second terminal 5 drawn out from the electrode 12 on the upper face of the ceramic element 1.

Further, as the conductive resin composition 3 in Example 1, a conductive resin composition, which includes (a) a curable resin 13 (FIG. 2) and (b) hard spherical carbon (average particle diameter: 6 μm) 14, is used.

As the curable resin 13 composing the conductive resin composition 3, a bisphenol A epoxy resin serving as a thermosetting resin is used.

As the hard spherical carbon 14, as shown in FIGS. 2, 4 and 5, there is used spherical carbon including a spherical base carbon particle 15 having an average particle diameter of 6 μm, which is composed of hard carbon, and fine carbon particles 16 with which the surface of the spherical base carbon particle is coated.

In the electronic component 10, as described above, since the conductive resin composition 3, which includes the curable resin (epoxy resin) 13 and the hard spherical carbon 14 formed by coating the surface of the spherical base carbon particle 15 with the fine carbon particles 16, is used, and as shown in FIG. 2, the hard spherical carbon 15 is incorporated into the first and the second conductors 11 and 22 and the fine carbon particles 16 on the surface of the hard spherical carbon 15 are incorporated into the first and the second conductors 11 and 22, the number of contacting points and the contacting area are large, and a good electrical connection which is low in resistance and high in conduction reliability can be attained.

Moreover, since the curable resin (epoxy resin) 13 is cured in a state in which the fine carbon particles 16 on the surface of the hard spherical carbon 15 are incorporated into the conductors, highly reliable bonding, which is highly resistant to mechanical impact and thermal impact, can be attained by the anchor effect of the fine carbon particles 16 incorporated into the conductors.

Next, a method for manufacturing the electronic component 10 will be described.

(1) 1200 g of a bisphenol A epoxy resin and 100 g of hard spherical carbon (average particle diameter: 6 μm) formed by coating the surface of hard spherical carbon (spherical base carbon particle) with fine carbon particles were charged into a mixing apparatus (planetary mixer) under reduced pressure, and the resulting mixture was stirred and mixed for 60 minutes to prepare a base conductive resin composition in which the hard spherical carbon was dispersed in an epoxy resin serving as a thermosetting resin.

In Example 1, a hard fine carbon particle having a primary particle diameter of 100 nm or less was used as the fine carbon particle.

(2) Thereafter, 55 g of an amine-based curing agent was added to 100 g of the base conductive resin composition, and the resulting mixture was stirred with a spatula, and defoamed for 15 minutes under reduced pressure to obtain a thermosetting conductive resin composition 3 containing hard spherical carbon in an amount of 5% by weight (FIGS. 1 and 2).

(3) Next, a syringe was filled with the obtained conductive resin composition, and the conductive resin composition was drawn on an aluminum base material (bottom of a case 2) 22 using a dispenser, and a ceramic element (piezoelectric element) 1 provided with electrodes 11 and 12 made of Ag on a lower and a upper faces was located thereon (refer to FIG. 1).

(4) Then, the ceramic element 1 was kept at 125° C. for 7 minutes while being pressurized by application of a force of 50 N to partly cure a curable resin (epoxy resin) 13 in the conductive resin composition 3, and after relaxing the force, the ceramic element 1 was further kept at 150° C. for 90 minutes to cure the curable resin (epoxy resin) 13 to prepare an electronic component element. In addition, the case 2 was not sealed at the stage of the electronic component element construction, but the case 2 is shown in a state of being sealed in FIG. 1.

Figure 6:
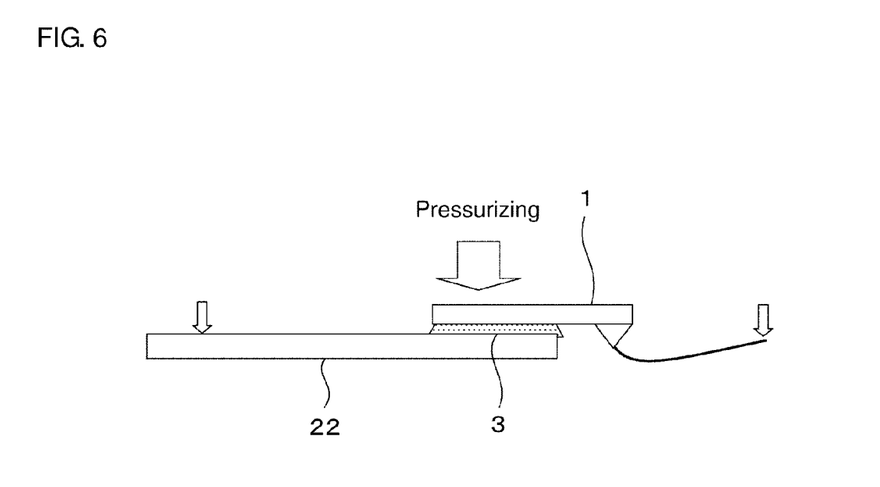
FIG. 6 is a view showing a measurement method of a connection resistance between the piezoelectric element and the aluminum base material connected to each other with a resin composition layer therebetween.

The connection resistance between the electrode (first conductor) 11 of the ceramic element (piezoelectric element) 1 and the aluminum base material (bottom (second conductor) of the case 2) 22 of this electronic component element was measured, and consequently, it was verified that the connection resistance was as low as 0.1Ω. In the measurement of the connection resistance, the resistance between the ceramic element (piezoelectric element) 1 and the aluminum base material 2, which had been connected to each other with the resin composition layer 3 therebetween, as shown in FIG. 6, was measured using a four-terminal method.

Figure 7:
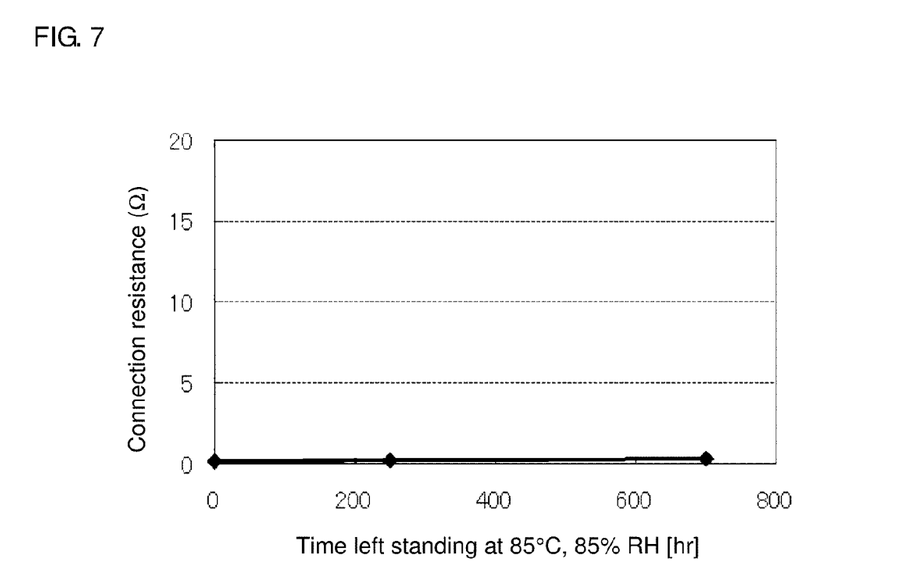
FIG. 7 is a graph showing the relationship between duration time and connection resistance in the case where an electronic component element prepared in Example 1 is maintained in the stressful environment of 85° C. and 85% RH.

Further, the connection resistance of the electronic component element, which was measured after leaving the electronic component element standing for 700 hours in a stressful environment of 85° C. and 85% RH, was 0.3Ω, and it was verified, as shown in FIG. 7, that there was observed little increase of the resistance.

The resonant resistance of the electronic component 10 (refer to FIG. 1) prepared by attaching terminals 4, 5 to the ceramic element 1 of the electronic component element and sealing the case 2 did not change largely (number of defects was zero) even after performing a moisture-resistant reliability test (85° C., 85% RH), and it was verified that a highly reliable electronic component is obtained.

The reason why the highly reliable electronic component can be obtained as described above is that since the conductive resin composition 3 containing the hard spherical carbon 14, the surface of which is coated with fine carbon particles 16, as a conductive component is used, the hard spherical carbon 14 is incorporated into the first and the second conductors 11, 22 and the fine carbon particles 16 on the surface of the hard spherical carbon 14 are incorporated into the conductors 11, 22 by curing the conductive resin composition 3 (curable resin 13) while pressing the ceramic element (piezoelectric element) 1 against the aluminum base material (bottom of the case) 22, and therefore the number of contacting points and the contacting area increase, and by the anchor effect of fine carbon particles 16 incorporated into the conductors, more firm electrical contacts can be formed to improve resistance to mechanical impact or thermal impact.

In addition, it was verified that in Example 1, the yield strength representing the hardness of the electrode 11 of the ceramic element (piezoelectric element) 1 was 55 MPa, the hardness (yield strength) of the aluminum base material (bottom of the case) 22 was 40 MPa, and the yield strength, measured by use of a micro compression testing machine, and representing the hardness of the spherical base carbon particle 15 and the fine carbon particle 16 composing the hard spherical carbon, was 660 MPa.

Example 2

In Example 2, hard spherical carbon (average particle diameter: 6 μm), the surface of which was coated with pitch-derived fine carbon pieces, was used as the hard spherical carbon used in the conductive resin composition.

Figure 8:
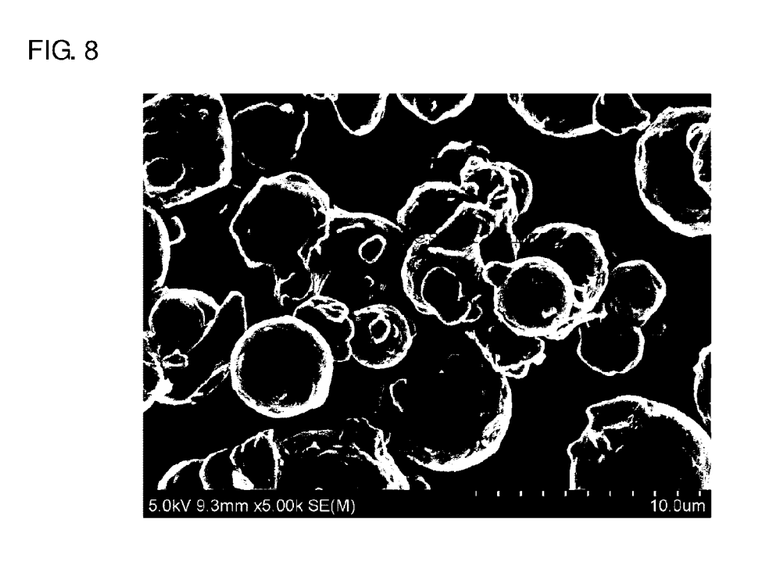
FIG. 8 is a microscope photograph of hard spherical carbon (hard spherical carbon, the surface of which is coated with pitch-derived fine carbon pieces), used in a conductive resin composition in Example 2 of the present invention.

FIG. 8 is a microscope photograph of hard spherical carbon composing the conductive resin composition used in Example 2. The conductive resin composition was prepared in the same conditions as in Example 1 described above, but using the hard spherical carbon shown in FIG. 8.

Then, using this conductive resin composition, an electronic component element similar to the electronic component element prepared in Example 1 was prepared in the same conditions and the same manner as in Example 1.

The connection resistance between the electrode of the ceramic element (piezoelectric element) and the aluminum base material (bottom of the case) of this electronic component element was measured using a four-terminal method as in Example 1. Consequently, it was verified that the connection resistance was as low as 0.2Ω.

Figure 9:
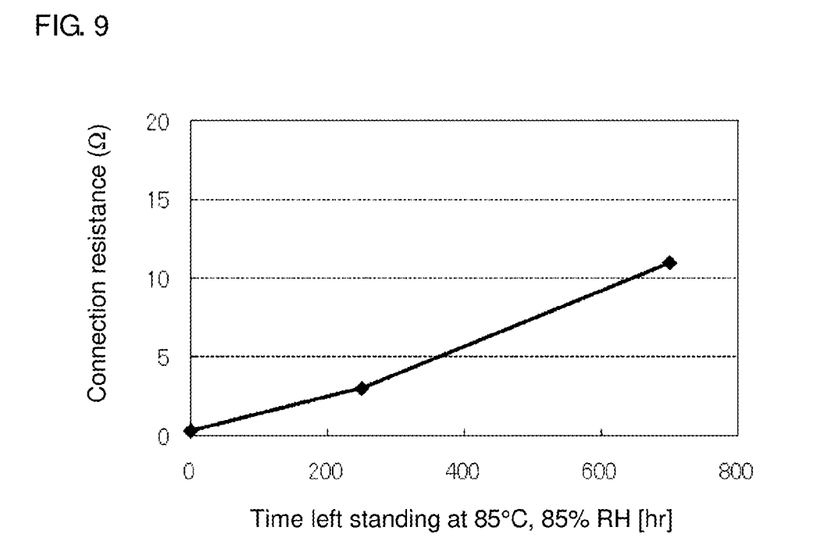
FIG. 9 is a graph showing the relationship between duration time and connection resistance in the case where an electronic component element prepared in Example 2 is maintained in the stressful environment of 85° C. and 85% RH.

Further, the connection resistance of the electronic component element measured after leaving the electronic component element standing for 700 hours in the stressful environment of 85° C. and 85% RH, was as large as 11Ω (refer to FIG. 9), but as in Example 1 described above, the resonant resistance of the electronic component prepared by attaching terminals to a ceramic element did not change largely (number of defects was zero) even after performing a moisture-resistant reliability test (85° C., 85% RH), and it was verified that a highly reliable electronic component is obtained.

Example 3

In Example 3, a conductive resin composition was prepared by using the same epoxy resin, the same hard spherical carbon, and the same curing agent as those in Example 1 as materials for the conductive resin composition, and varying only a mixing ratio of these compounds.

That is, the amount of the hard spherical carbon mixed with respect to 1200 g of a bisphenol A epoxy resin in Example 3 was changed to 9 g, 220 g, and 545 g to prepare these conductive resin compositions in which the content of the hard spherical carbon was 0.5% by weight, 10% by weight, and 20% by weight, respectively.

In order to evaluate the ease of application to the conductor being an object to be bonded, the viscosity of each conductive resin composition was measured. The viscosities of the respective conductive resin composition (relationship between the content of the hard spherical carbon and the viscosity of the conductive resin composition (base resin) measured before adding a curing agent) are shown in Table 1.

TABLE 1

| Content of carbon | Viscosity of base resin | Connection resistance | Position misalignment |
|---|---|---|---|
| 0.5% by weight | 14,400 mPa · s | 0.1 Ω | none |
| 5% by weight (Example 1) | 15,300 mPa · s | 0.1 Ω | none |
| 10% by weight | 20,000 mPa · s | 0.1 Ω or less | none |
| 20% by weight | 45,100 mPa · s | 0.1 Ω or less | some displacements |

Using these three conductive resin compositions, an electronic component element was prepared in the same manner as in Example 1.

Then, the connection resistance between the electrode of the ceramic element (piezoelectric element) and the aluminum base material (bottom of the case) of the prepared electronic component element was measured using a four-terminal method as in Example 1, and consequently it was verified that the connection resistance of the electronic component elements was as low as 0.1Ω.

It was further investigated whether there is a displacement of the position at the time of bonding each ceramic element (piezoelectric element) to the aluminum base material or not. The results of the measurements are also shown in Table 1.

Table 1 shows that when the conductive resin composition in which the content of the hard spherical carbon was less than 20% by weight was used, workability was good, and there was no occurrence of position misalignment of the ceramic element. However, when the conductive resin composition in which the content of the hard spherical carbon was 20% by weight was used, since viscosity was high, and application workability was poor, the application position was displaced a little, and there was a tendency of the occurrence of position misalignment of the ceramic element.

Accordingly, when high position accuracy is required, it is preferred to use a conductive resin composition formed by mixing the hard spherical carbon at the proportion of less than 20% by weight.

Comparative Example 1

55 g of an amine-based curing agent was added to 100 g of a bisphenol A epoxy resin, and the resulting mixture was stirred with a spatula, and defoamed for 15 minutes under reduced pressure to prepare a thermosetting resin which did not contain carbon.

Then, using this thermosetting resin in place of the conductive resin composition in Example 1, an electronic component element was prepared in the same manner as in Example 1.

Thereafter, the connection resistance between the electrode of the ceramic element (piezoelectric element) and the aluminum base material (bottom of the case) of the prepared electronic component element was measured using a four-terminal method as in Example 1, and consequently it was verified that the connection resistance was as low as 0.04Ω.

The reason for this is likely that although the thermosetting resin not containing carbon used in this comparative example is insulating, metal contact occurs between the electrode of the ceramic element (piezoelectric element) and the aluminum base material (bottom of the case 2) 22 as a result of press-bonding and therefore the connection resistance is decreased.

Further, it was verified that the connection resistance of the electronic component element, measured after leaving the electronic component element standing for 700 hours in the stressful environment of 85° C. and 85% RH, was as large as 7Ω.

Figure 10:
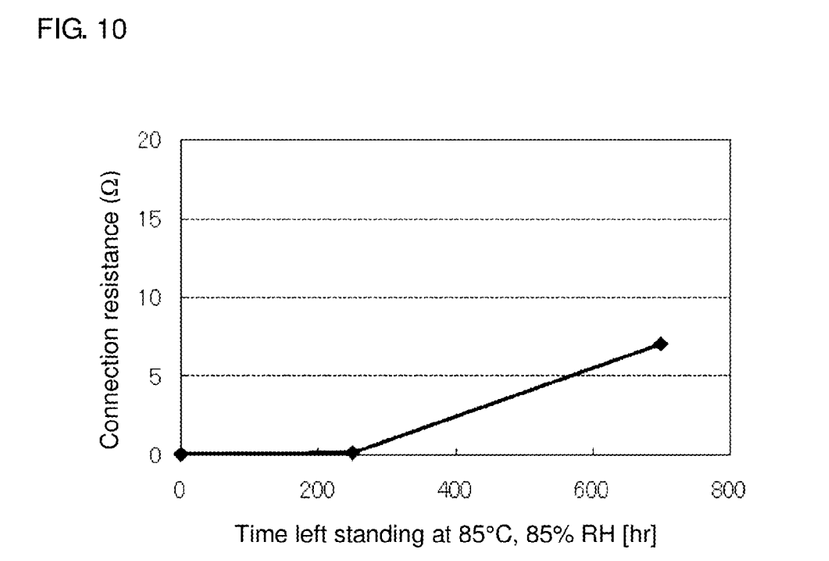
FIG. 10 is a graph showing the relationship between duration time and connection resistance in the case where an electronic component element prepared in Comparative Example 1 is maintained in the stressful environment of 85° C. and 85% RH.

The resonant resistance of the electronic component, prepared by attaching terminals to the electronic component element and sealing the case as in Example 1, began exhibiting becoming defective (increased connection resistance) after leaving the electronic component standing for 250 hours in a moisture-resistant reliability test (85° C., 85% RH). FIG. 10 shows that the connection resistance reached 7Ω after leaving the electronic component standing for 700 hours). The percent defective of the electronic component reached 20% after leaving the electronic component standing for 1000 hours.

From Comparative Example 1, it was verified that when the thermosetting resin not containing carbon is used as an adhesive, the initial connection resistance is low since metal contact between conductors occurs, but the connection resistance increases and sufficient bonding reliability is not achieved in the loaded condition in a moisture-resistant reliability test. The reliable bonding state based on the carbon incorporated into conductors that is achieved when using the conductive resin composition of the present invention is not obtained.

Comparative Example 2

A conductive resin composition was prepared in the same conditions as in Example 1 except for using hard spherical carbon having an average particle diameter of 14 μm as the hard spherical carbon in the conductive resin composition. The content of the hard spherical carbon was set at 5% by weight similar to Example 1. Then, using this conductive resin composition, an electronic component element was prepared in the same manner and the same conditions as those in Example 1 described above.

The connection resistance between the electrode of the ceramic element (piezoelectric element) and the aluminum base material (bottom of the case) of the prepared electronic component element was measured using a four-terminal method as in Example 1. As a result of this, it was verified that the connection resistance of the electronic component element in Comparative Example 2 using the hard spherical carbon having an average particle diameter of 14 μm was 3Ω, and this connection resistance was significantly (thirty times) larger than that of 0.1Ω in Example 1 using the hard spherical carbon having an average particle diameter of 6 μm.

Figure 11:
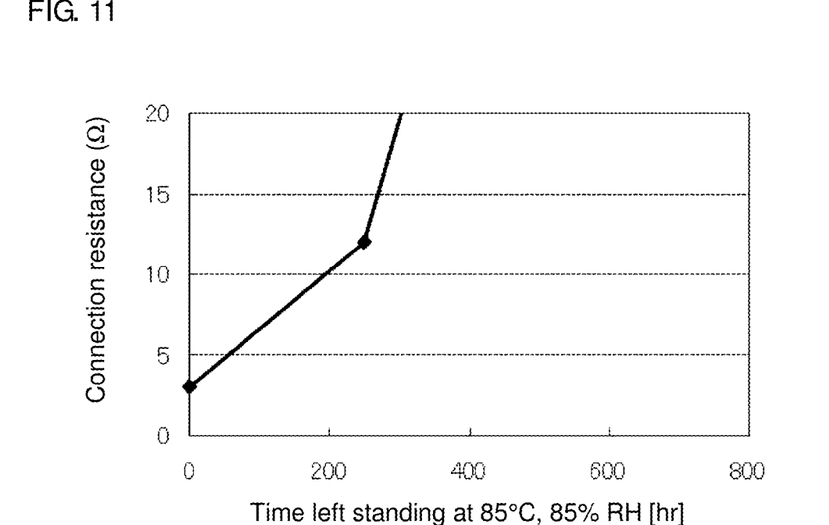
FIG. 11 is a graph showing the relationship between duration time and connection resistance in the case where an electronic component element prepared in Comparative Example 2 is maintained in the stressful environment of 85° C. and 85% RH.

Further, the connection resistance of the electronic component element, measured after leaving the electronic component element standing for 300 hours in the stressful environment of 85° C. and 85% RH, was 20Ω as shown in FIG. 11. An unacceptably large connection resistance of 20Ω resulted after leaving the electronic component standing for 700 hours.

Moreover, the resonant resistance of the electronic component, prepared by attaching terminals to the ceramic element as in Example 1, exhibited an increase being defective after leaving the electronic component standing for 250 hours in a moisture-resistant reliability test (85° C., 85% RH).

From Comparative Example 2, it was verified that when the particle diameter of the hard spherical carbon is too large, the number of the hard spherical carbon per the additive amount (weight) of the hard spherical carbon (the number of hard spherical carbon elements having the same total weight) decreases, the number of contacting points decreases and the connection resistance increases. Since the thickness of the adhesive layer increases, permeation of moisture easily occurs in a moisture-resistance test and the connection resistance increases.

Comparative Example 3

Figure 12:
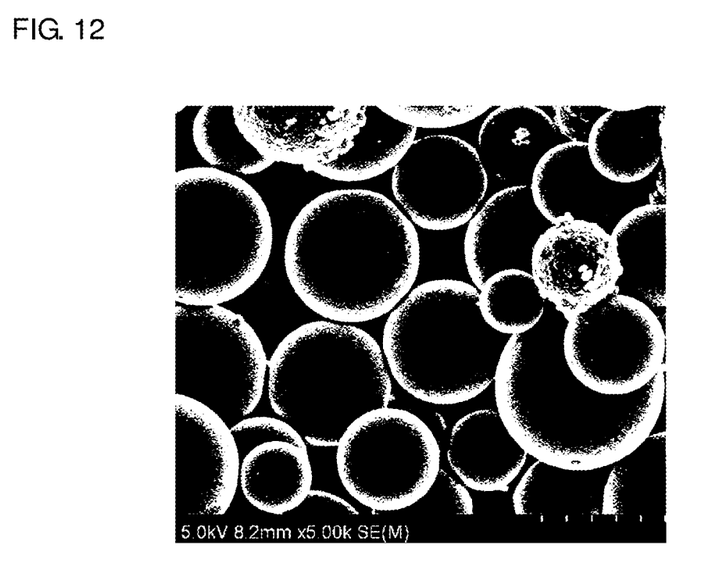
FIG. 12 is a microscope photograph of hard spherical carbon (hard spherical carbon, the surface of which is not coated with fine carbon particles or pitch-derived fine carbon pieces), used in a conductive resin composition in Comparative Example 3.

A conductive resin composition in which the content of the hard spherical carbon was 5% by weight, similar to Example 1, was prepared, using the same conditions as in Example 1 except for using a hard spherical carbon (refer to FIG. 12) having an average particle diameter of 7 μm, the surface of which was not coated with fine carbon particles or pitch-derived fine carbon pieces. Then, using this conductive resin composition, an electronic component element was prepared in the same manner and the same conditions as those in Example 1 described above.

The connection resistance between the electrode of the ceramic element (piezoelectric element) and the aluminum base material (bottom of the case) of the prepared electronic component element was measured using a four-terminal method as with Example 1. As a result of this, it was verified that the connection resistance of the electronic component element in Comparative Example 3 using the hard spherical carbon (average particle diameter 7 μm), the surface of which was not coated with fine carbon particles or pitch-derived fine carbon pieces, was 0.9Ω, and that the connection resistance was significantly (nine times) larger than that of 0.1Ω in Example 1 using the hard spherical carbon having an average particle diameter of 6 μm, the surface of which was coated with fine carbon particles.

Figure 13:
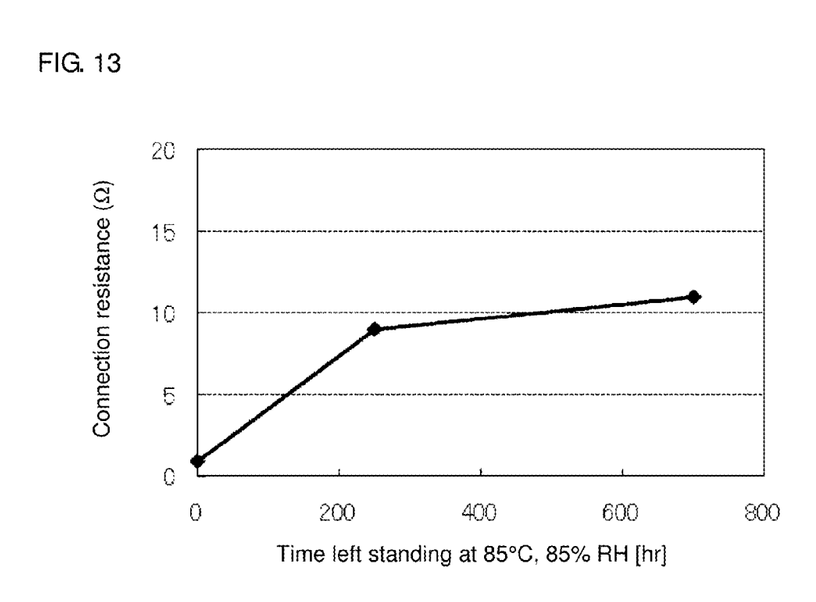
FIG. 13 is a graph showing the relationship between duration time and connection resistance in the case where an electronic component element prepared in Comparative Example 3 is maintained in the stressful environment of 85° C. and 85% RH.

Further, the connection resistance of the electronic component element, measured after leaving the electronic component element standing for 700 hours in the stressful environment of 85° C. and 85% RH, increased to 11Ω (refer to FIG. 13).

Moreover, the resonant resistance of an electronic component prepared by attaching terminals to the ceramic element as in Example 1, was found to tend to increase in a moisture-resistant reliability test (85° C., 85% RH), and it was verified that the electronic component is not preferable.

From Comparative Example 3, it was verified that when the hard spherical carbon, the surface of which is not coated with fine carbon particles or pitch-derived fine carbon pieces, is used, the connection resistance increases due to the reduction in the number of contacting points and the contacting area, and the bonding reliability is low since the anchor effect based on the fine carbon particles or pitch-derived fine carbon pieces is not realized.

Comparative Example 4

A ceramic element (electronic component element) was prepared by using the same conductive resin composition as in Example 1 and in the same manner as in Example 1 except for not pressurizing the ceramic element against the aluminum base material when bonding the ceramic element to the aluminum base material.

That is, a conductive resin composition similar to that in Example 1, in which hard spherical carbon coated with fine carbon particles was mixed, was used, the ceramic element was kept at 125° C. for 7 minutes without being pressurized against an aluminum base material when being bonded to the aluminum base material to partly cure the curable resin in the conductive resin composition, and the ceramic element was further kept at 150° C. for 90 minutes without being pressurized to cure the curable resin (epoxy resin) 13 and prepare the ceramic element (electronic component element).

The connection resistance between the electrode of the ceramic element (piezoelectric element) and the aluminum base material (bottom of the case) of the ceramic element was measured using a four-terminal method, and consequently, it was found that the connection resistance was as extremely large as 100Ω or more.

From Comparative Example 4, it was verified that when the conductive resin composition is not pressurized when being cured, the effect of improving connection characteristics by the carbon incorporated into the object is not achieved.

In Examples 1, 2 and 3, thermosetting epoxy resin was used as the curable resin in the conductive resin composition, and in the present invention, a thermosetting resin is usually used as a preferable curable resin. As the thermosetting resin, thermosetting resins such as a phenolic resin, a urea resin, a melamine resin, an unsaturated polyester resin, polyurethane and thermosetting polyimide can also be employed, and further various curable resins such as an anaerobic curable resin can be employed.

Further, in each example described above, examples of the case where the piezoelectric element is bonded to the aluminum base material have been described, but the type of the object (type of work) to be bonded is not limited to this, and the present invention can be widely applied to a case in which a first conductor is bonded to a second conductor, including an application in which a ceramic element other than the piezoelectric element is mounted on a land of a circuit board.

The present invention is not limited to the above examples also in other points, and various applications or variations concerning the proportion of the hard spherical carbon in the conductive resin composition, and application conditions and curing conditions of the conductive resin composition can be made within the scope of the present invention.

DESCRIPTION OF REFERENCE SYMBOLS

1 Ceramic element (piezoelectric element)
2 Case (aluminum base material)
3 Conductive resin composition (conductive adhesive)
4 First terminal
4' First terminal lead
5 Second terminal
5' Second terminal lead
10 Electronic component
11 Electrode on a lower face side of a ceramic element (first conductor)
12 Electrode on an upper face side of a ceramic element
13 Curable resin (epoxy resin)
14 Hard spherical carbon
15 Spherical base carbon particle
16 Fine carbon particle
22 Bottom of a case (second conductor)
23 Side of a case

The invention claimed is:

1. A bonding structure bonding one conductor to the other conductor so as to be electrically connected, comprising a pair of conductors with a cured conductive resin composition comprising (a) a cured resin and (b) hard spherical carbon having an average particle diameter of 10 μm or less, the hard spherical carbon itself having a compression strength of 200 MPa or more, and the hard spherical carbon comprising solid spherical carbon particles whose surface is coated with fine carbon particles or pitch-derived fine carbon pieces or both interposed between the conductors, wherein the hard spherical carbon in the conductive resin composition is hard amorphous carbon and has a higher hardness than either member of the pair of conductors, and wherein a part of the solid spherical carbon particles and the fine carbon on the surface of the solid spherical carbon particles are incorporated into a surface of both conductors.

2. A bonding structure according to claim 1, wherein at least one of the conductors is an electrode disposed on a piezoelectric.

3. The bonding structure according to claim 1, wherein the primary particle diameter of the fine carbon particles and pitch-derived fine carbon pieces is 0.1 μm or less, and the content of the fine carbon particles and pitch-derived fine carbon pieces is 1 to 40% by weight of the hard spherical carbon.

4. The bonding structure according to claim 1, wherein the spherical carbon particle surface is coated with fine carbon particles.

5. The bonding structure according to claim 1, wherein the spherical carbon particle surface is coated with pitch-derived fine carbon pieces.

6. A bonding structure according to claim 1, wherein the content of the hard spherical carbon in the composition is 0.5 to 20% by weight.

7. The bonding structure according to claim 6, wherein the primary particle diameter of the fine carbon particles and pitch-derived fine carbon pieces is 0.1 μm or less.

8. The bonding structure according to claim 7, wherein the fine carbon particles and pitch-derived fine carbon pieces are 1 to 40% by weight of the hard spherical carbon.

9. The bonding structure according to claim 8, wherein the spherical carbon particle surface is coated with fine carbon particles.

10. The bonding structure according to claim 8, wherein the spherical carbon particle surface is coated with pitch-derived fine carbon pieces.

* * * * *